United States Patent [19]

Meinzer

[11] Patent Number: 5,012,200
[45] Date of Patent: Apr. 30, 1991

[54] METHOD AND SYSTEM FOR THE LINEAR AMPLIFICATION OF SIGNALS

[75] Inventor: Karl Meinzer, Marburg, Fed. Rep. of Germany

[73] Assignee: Messerschmitt-Boelkow-Blohm GmbH, Munich, Fed. Rep. of Germany

[21] Appl. No.: 424,665

[22] Filed: Oct. 20, 1989

Related U.S. Application Data

[63] Continuation-in-part of Ser. No. 252,491, Sep. 30, 1988, abandoned.

[30] Foreign Application Priority Data

Oct. 2, 1987 [DE] Fed. Rep. of Germany ....... 3733374

[51] Int. Cl.$^5$ .............................................. H03F 3/68
[52] U.S. Cl. ................................. 330/124 R; 330/295
[58] Field of Search ............. 330/109, 124 D, 124 R, 330/295, 84; 333/124, 213, 214, 216

[56] References Cited

U.S. PATENT DOCUMENTS 4,193,033  3/1980  Voorman ..................... 333/215 X
4,811,422  3/1989  Kahn ............................ 330/124 R X

FOREIGN PATENT DOCUMENTS 2556706  8/1976  Fed. Rep. of Germany .
2810194  9/1978  Fed. Rep. of Germany .
2807813  6/1979  Fed. Rep. of Germany .
3118845  5/1981  Fed. Rep. of Germany .

OTHER PUBLICATIONS

A New High Efficiency Power Amplifier for Modulated Waves, W. H. Doherty, Proc. Ire, vol. 24, Sep. 1936, pp. 1163, 1166–1183.
High Power Outphasing Modulation, H. Chireix, Proc. Ire, vol. 23, Nov. 1935, pp. 1370–1392.
Instruction Manual of the VP-100 Transmitter, Gates Radio Corp., Quincy, Ill., U.S.A.
Lineare Nachrichtentransponder durch nichtlineare Signalzerlegung, K. Meinzer, Inaugural-Dissertation, Marburg, Federal Republic of Germany, 1973.

Primary Examiner—Steven Mottola
Attorney, Agent, or Firm—W. G. Fasse; D. H. Kane, Jr.

[57] ABSTRACT

The amplification efficiency is increased in a system for linear amplification of signals, especially in satellite transponders, by connecting at least three amplifier impedance inverter units in parallel to each other between an input signal control network and a common load. The reactive loading of the individual amplifiers is compensated by shunt susceptances at the output ports of the individual amplifiers.

3 Claims, 6 Drawing Sheets

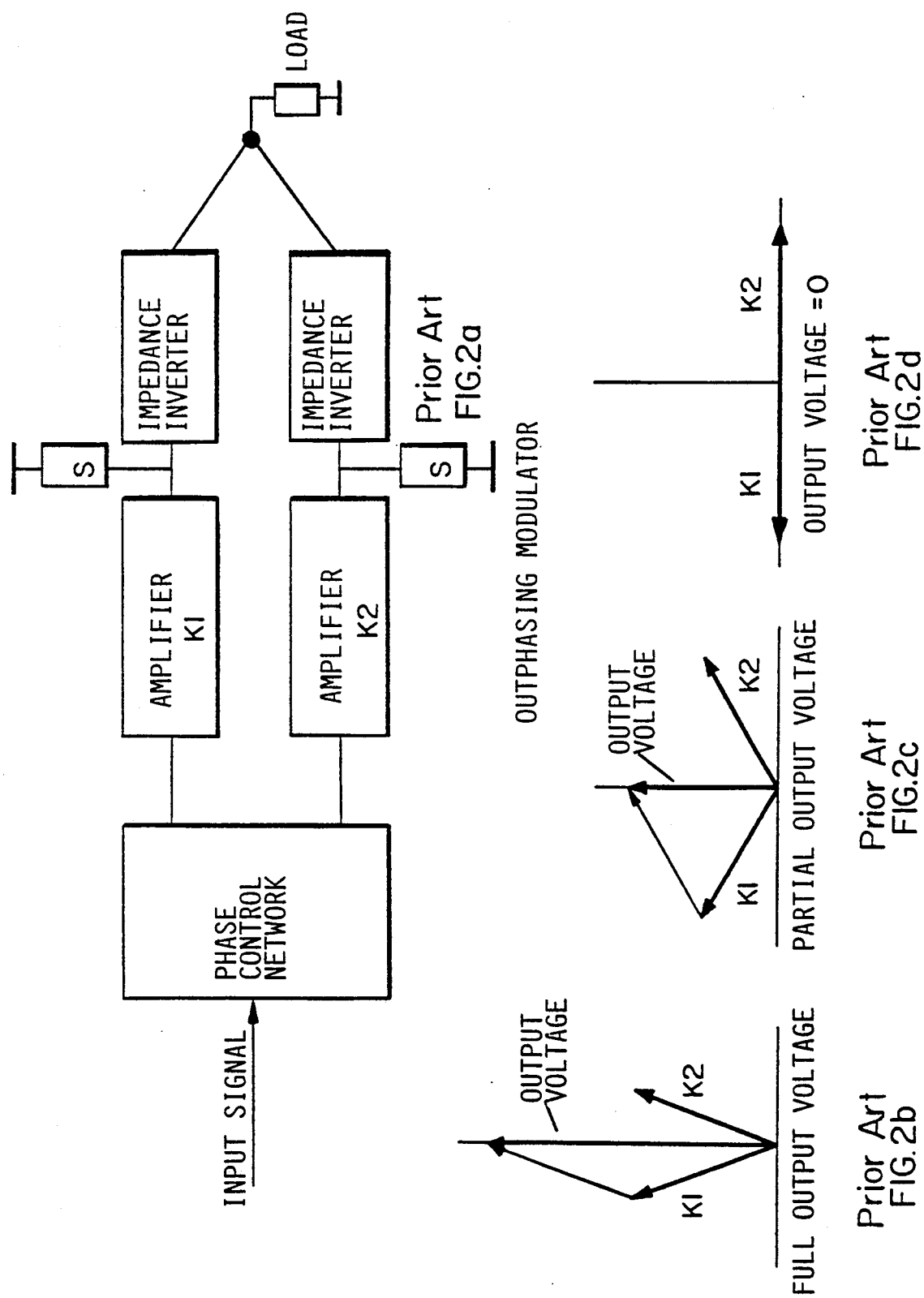

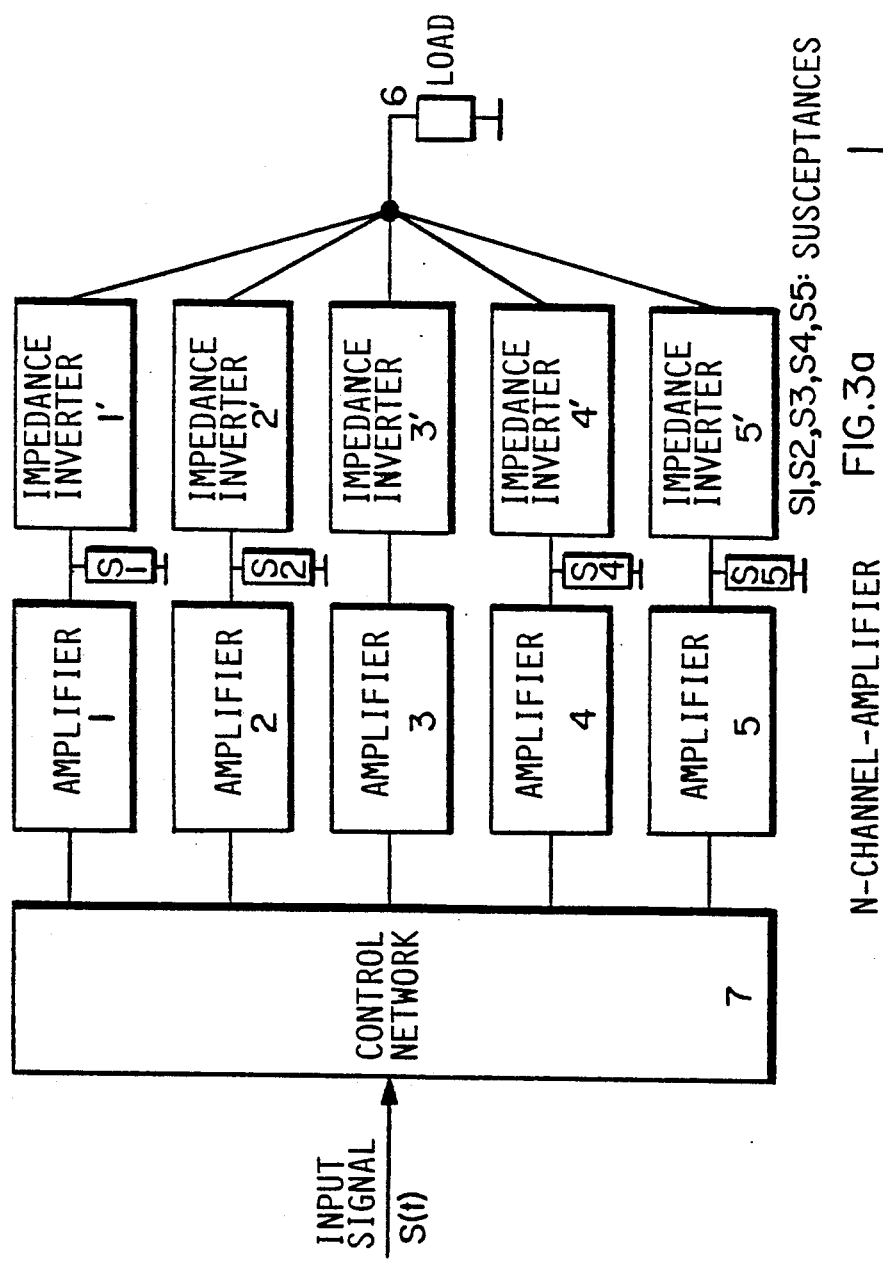

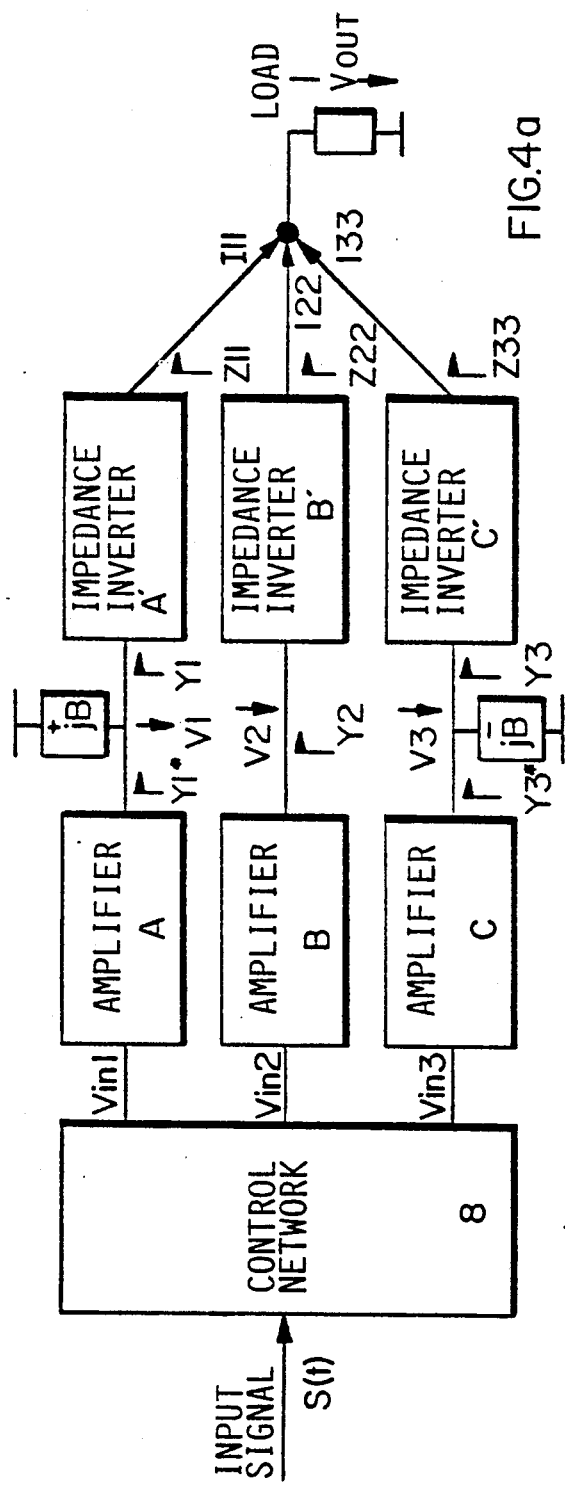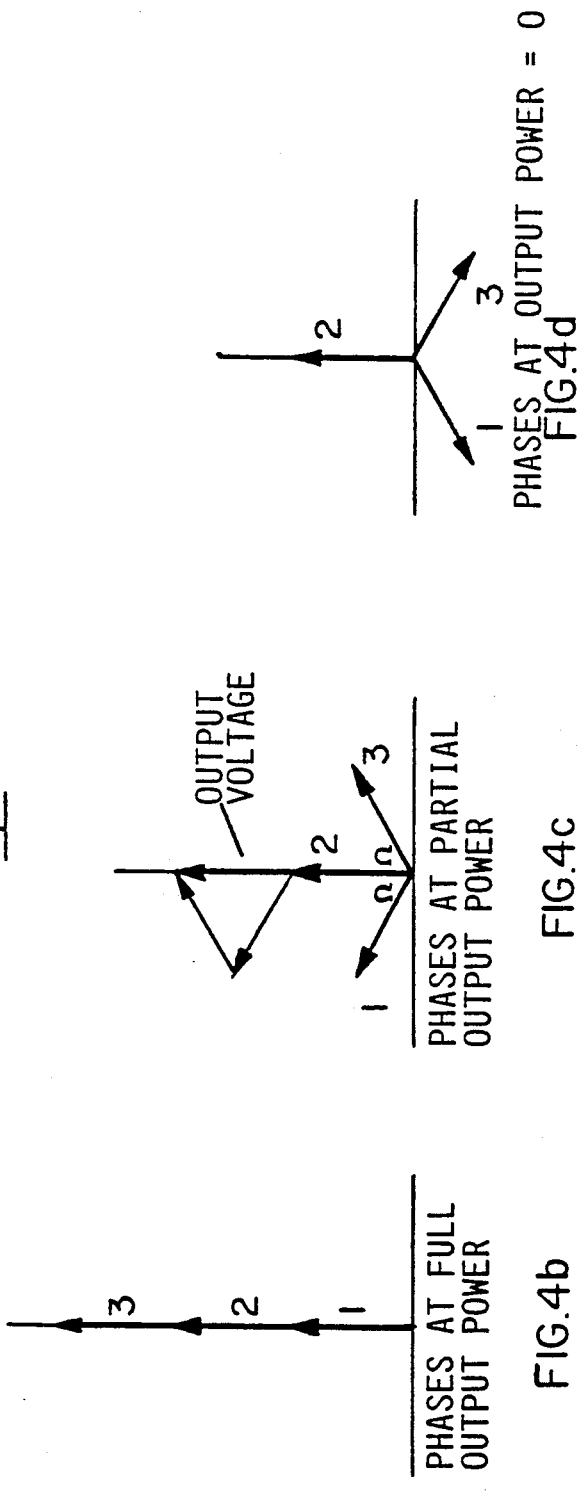

METHOD AND SYSTEM FOR THE LINEAR AMPLIFICATION OF SIGNALS

CROSS-REFERENCE TO RELATED APPLICATION

The present invention is a continuation-in-part patent application of U.S. Ser. No. 07/252,491, filed on Sept. 30, 1988, now abandoned, and entitled: METHOD AND SYSTEM FOR THE LINEAR AMPLIFICATION OF SIGNALS, now abandoned.

FIELD OF THE INVENTION

The invention relates to a method and system for the linear amplification of signals, especially signals in satellite transponders.

BACKGROUND INFORMATION

All conventional linear amplifiers are subject to a reduction in the amplification efficiency when a partial modulation control is effective. This fact is independent of the amplifier operating point. In the present context the term "conventional amplifiers" means amplifiers in which the main supply voltage or the load are not dynamically controlled as a function of the instantaneous output power. Considerations generally applicable to such amplifiers show that the amplification efficiency cannot be better than being proportional to the signal voltage. Since practically all amplifiers have this characteristic, it is conventional to specify the amplifier characteristics at full input (output) voltage. The reduction in the amplification efficiency at partial output voltage or power is accepted as an unavoidable fact of nature.

Linear amplifiers of satellite transponders must be so controllable that relatively infrequent peak values are still transmitted without distortion. Such relatively infrequent peak values are formed by the vectorial addition of individual peak values which in turn are formed by the vectorial addition of the individual user signals (SCPC: single channel per carrier) in the transponder. As a result, the average signal power or voltage of the transponder becomes 4 to 8 dB smaller as compared to a full output power or voltage. This phenomenon is known as "backoff" and such backoff has the disadvantage that the efficiency of the transponder system becomes 1.5 to 3 times smaller than the characteristic values would tend to indicate for a full control or modulation.

The reasons for the reduction in the amplification efficiency are the following. Linear amplifiers are operated by applying a constant supply voltage to the collector. The amplifier is so dimensioned that on full output power or voltage the output transistor or the electron vacuum tube is optimally matched to the load. When a partial output power or voltage occurs, for example, when the output voltage is only 50%, the output power is reduced to 25% of the original output power due to the relationship ($P=U^2/R$), wherein P is the output power, U is the output voltage, and R is the load. Since the operating voltage of the amplifier is constant, the d.c. current input power is reduced only to 50% at this so-called half current operation. Thus, the problem is that the matching of the amplifier at half output voltage is actually mismatched. In fact, the supply voltage should also be reduced to one half in order to maintain a good amplification efficiency.

The same problem is encountered in amplitude modulated radio transmitters. Thus, any methods developed in connection with radio transmitters with regard to the just mentioned problem, are also basically usable in connection with satellite transponders. However, so far only AMSAT has used such methods in space.

Basically, there are two ways of keeping the amplification efficiency constant. One method involves modulating or controlling the collector voltage of the transmitter transistor as a function of the input signal. The other method involves using two amplifier channels which work into suitable output networks. In both instances, the load impedance at the amplifier output becomes variable so that for all loads the optimal matching is maintained.

Both conventional methods have been used in connection with radio technology and with corresponding modifications in amateur satellites. The following literature is relevant in this connection.

(1) A new high Efficiency Power Amplifier for Modulated Waves, W. H. Doherty, Proc. IRE, Vol. 24, Sept. 1936, pp 1163.

(2) High Power Outphasing Modulation, H. Chireix, Proc. IRE, Vol. 23, Nov. 1935, pp. 1370.

(3) Instruction Manual of the VP-100 Transmitter, Gates Radio Corp., Quincy, Illinois, USA.

(4) Lineare Nachrichtentransponder durch nichtlineare Signalzer legung, K. Meinzer, Inaugural-Dissertation, Marburg, Federal Republic of Germany, 1973. (Linear Communication Transponders by Non-linear Signal Separation).

Special problems occur, however, in connection with L-band transponders. In the L-band, especially in the range of 1500 to 1700 MHz, the output powers presently obtainable with semiconductor amplifiers are within the range of 20 to 40 W (PEP-Peak Envelope Power). However, in most transponder applications larger output powers are required so that a parallel connection of a substantial number of amplifier modules is unavoidable. The large number of amplifiers causes a problem because hybrid matching circuits are required and these hybrid matching circuits make it impossible to take advantage of the principle of a variable amplifier load output impedance. A variation of the collector voltage, for instance by means of a pulse width modulator, regularly fails because the amplifier band-width cannot exceed a few MHz. This is so because the modulator must be capable of handling three times the transponder band-widths.

OBJECTS OF THE INVENTION

In view of the foregoing it is the aim of the invention to achieve the following objects singly or in combination:

to provide a method and system for the linear amplification of signals, especially satellite transponder signals, which makes it possible to increase the amplification efficiency of such amplifiers in a substantial way;

to provide highly efficient linear amplifiers, especially for satellite transponders, capable of working at very high frequencies and having very wide bandwidths; and to operate the transistors of such amplifiers in the so-called "cold" state so that a very high reliability may be achieved.

SUMMARY OF THE INVENTION

According to the invention at least three linear amplifiers work through impedance inverters onto a common load. It is especially advantageous when the number of amplifiers used in the system is an uneven number since one amplifier will not have a reactive component.

Especially the so-called N-channel method and system according to the invention attacks the above described problem at its base because the present N-channel amplifier shows that the decrease in the amplification efficiency in the transponder can be avoided at a normal partial signal voltage or power. It has been found that the present system has an amplification efficiency which remains practically constant even at a partial signal voltage or power, whereby the transponder efficiency is increased by a factor within the range of 1.5 to 3.

BRIEF DESCRIPTION OF THE DRAWINGS

In order that the invention may be clearly understood, it will now be described, by way of example, with reference to the accompanying drawings, wherein:

FIG. 2a shows a block diagram of a conventional amplifier system with two amplifiers for the so-called "outphasing modulation";

FIGS. 2b, 2c, 2d show the input voltages to amplifiers K1 and K2 of the system according to FIG. 2a at a full output voltage, a partial output voltage, and no output voltage respectively;

FIG. 3a is a block diagram of a linear amplifier system according to the invention referred to as the N-channel amplifier having, for example, five amplifiers;

FIGS. 3b, 3c, 3d show the input signal voltages at full output voltage (power), at a partial output voltage, and at no output voltage respectively;

FIG. 4a shows a three channel amplifier system according to the invention;

FIGS. 4b, 4c, 4d show the input signal voltages at full output voltage (power), partial output voltage, and no output voltage respectively;

DESCRIPTION OF PREFERRED EXAMPLE EMBODIMENTS AND OF THE BEST MODE OF THE INVENTION

Figure 1:
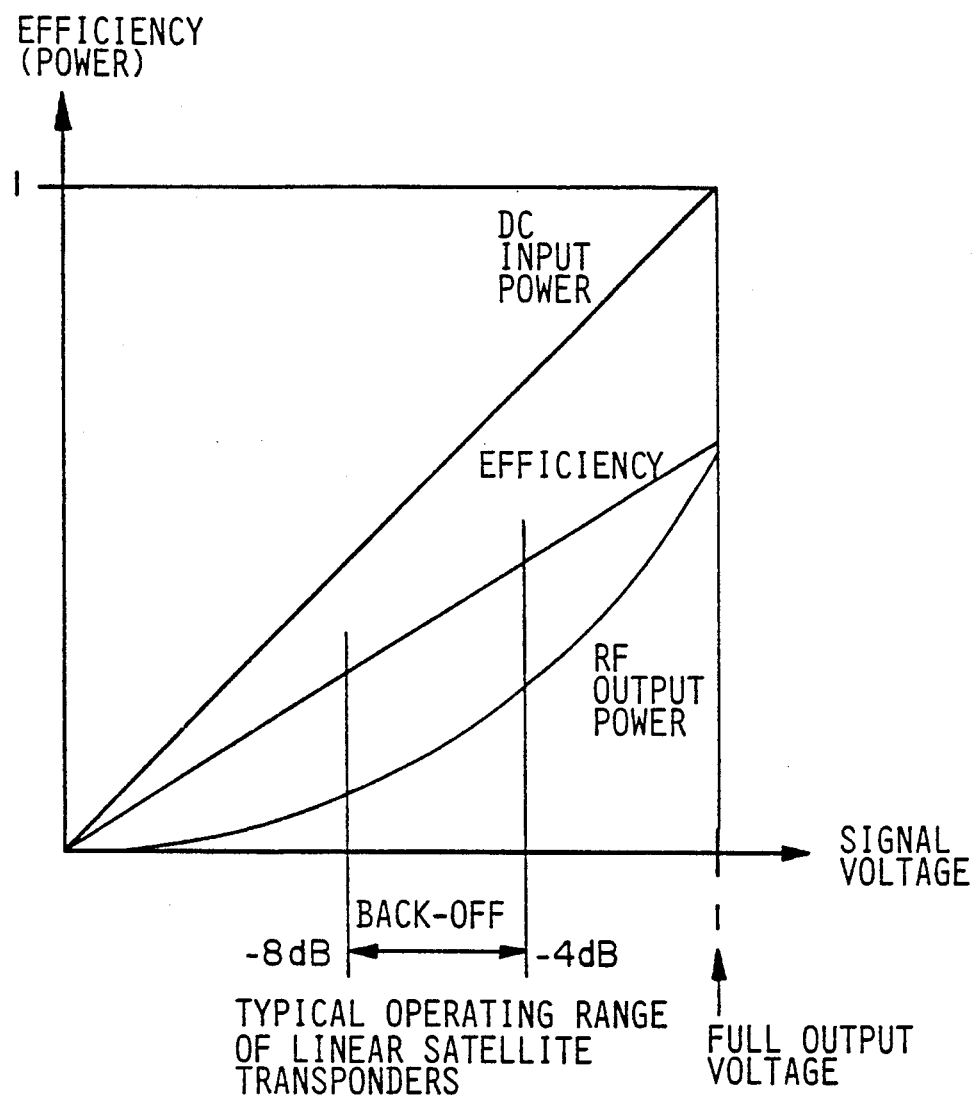
FIG. 1 shows a diagram of conventional amplification methods illustrating the powers and the amplification efficiency as a function of the signal voltage.

The characteristic curves of FIG. 1 show schematically the known basic characteristics of typical linear amplifiers. General considerations applicable to such linear amplifiers show that the amplification efficiency cannot be better than proportional to the control or modulation voltage. Practically all amplifiers have this characteristic. Therefore, it is customary to specify or dimension the linear amplifiers at full output voltage or power. The decrease in efficiency at partial output voltage or power is accepted as inevitable.

FIGS. 2a, 2b, 2c, and 2d show schematically a conventional so-called outphasing modulator and its characteristics. Such an outphasing modulator comprises two amplifier circuits K1 and K2 connected with respective impedance inverters. The series circuits of amplifier and impedance inverter are connected in parallel between a load and a phase control network.

The invention starts from the fact that in an amplification method employing two amplifier channels with a phase control as shown in FIG. 2a, the collector current characteristic is an approximately square function of the input signal, whereby the amplitude spectrum remains approximately limited to the amplitude spectrum of the transponder band-width. As a result, such methods are especially suitable when high band-widths must be achieved. Although the reactive loading of the amplifiers K1 and K2 is partially compensated by the shunt susceptances S, the remaining relatively high reactive current component in the amplifiers causes the efficiency to be basically somewhat worse than in systems employing collector voltage variations. Additionally, only two transistors can be combined so that the output power remains limited.

Referring to FIGS. 3a, 3b, 3c, and 3d showing an embodiment of the invention in the form of a so-called N-channel amplifier having, for example, five amplifiers 1, 2, 3, 4, and 5 connected individually to respective impedance inverter circuits 1', 2', 3', 4' and 5' to form amplifier impedance inverter units which are connected in parallel to each other between an output load 6 and a control network 7. According to the invention at least three such amplifier impedance inverter units are connected in parallel between a load and a control network. The control network is so constructed that the individual amplifiers 1 to 5 are controlled to assure a linear transfer function. Each individual amplifier operates with a constant high frequency output voltage. Therefore, an optimal matching is assured at all input voltages. The use of an uneven number of amplifiers has the further advantage that one amplifier is free of reactive currents, whereby an even better efficiency can be obtained than with the state-of-the-art method using two channels. Another advantage of the larger number of parallel connected amplifier impedance inverter units is seen in that a respectively higher output power is obtained.

FIGS. 4a, 4b, 4c, and 4d show another embodiment of an amplifier system according to the invention comprising three amplifier channels with amplifiers A, B, and C individually connected to the respective impedance inverter circuit A', B' and C'. The so-formed amplifier impedance inverter series units are connected in parallel with each other between an output load and a control network 8. The three channel system according to the invention achieves an output power which is 1.5 times the output power obtainable in a Doherty transmitter described in the first above mentioned reference or in a Chireix transmitter described in the above mentioned second reference. An additional improvement in the efficiency according to the invention is achieved because one of the three amplifier channels does not carry any reactive current. The three-channel system according to the invention can be employed in all those instances when three transistors provide sufficient power for the transponder. The collector currents contain substantial components that are dependent on the square of the input signal. Therefore, the method and system according to the invention has an inherently wider band-width than is possible with conventional linear amplifiers. The amplitude spectrum of the input signal is substantially not limited and contains frequency components up to three times the amplifier band-width. The spectrum of the square of the input signal is limited and comprises only frequency components up to the transponder band-width.

According to the invention, especially the embodiment with N-number of channels makes it possible to construct transponders with very high frequencies and very high band-widths. The amplification efficiency of amplifiers according to the invention is 1.5 to 3 times larger than is conventionally possible in linear amplifiers. Additionally, the output power of at least three transistors is combined so that the present method does not call for any additional expenses as compared to conventional methods in which also the power of several transistors must be combined. Another important advantage of the invention is seen in that the present transistors can operate under so-called "cold" operating conditions at relatively lower temperatures compared to the prior art so that a very high reliability is to be expected. The reason for the "cold" operating conditions is, that due to the high efficiency, the power dissipated within the amplifiers is very low.

DETAILED DESCRIPTION OF THE FUNCTION

The signal S(t) for addressing the N-channel amplifier can be expressed in a generally valid form as follows:

$$S(t) = E(t) \cdot P(t), \text{ wherein}$$

$$E(t) = V_{inO}[V_{in}(t)/V_{inO}]$$

represents the envelope curve of the "eigen" voltage. The envelope curve can assume all values (partial modulations) between zero and the maximum voltage $V_{inO}$.

$$P(t) = \sin[wt + phi(t)]$$

represents the angle modulated portion of the control signal. P(t) is characterized by a constant amplitude. Thus, the investigation of the dependency of the efficiency of an amplifier from its modulation or degree of control can be limited to an examination with the envelope curve.

The function of amplifiers according to the invention will now be described in detail with reference to an example of a three channel amplifier according to FIGS. 4a to 4d.

The three individual amplifiers A, B, C are connected in common by impedance inverters to the load. The individual amplifiers are controlled by the control network in such a manner that a linear transfer function is obtained for the entire three channel amplifier. The amplifiers A and C receive addressing control signals, the phases of which vary in a direction opposite to that of the instantaneous input voltage function (envelope curve). The amplifier B is addressed or controlled with a constant phase. The contribution made by each amplifier must be determined for each individual amplifier for calculating the uniform power input and thus the amplifier efficiency. The individual voltages and currents may be determined by means of the vector diagrams in FIGS. 4a to 4d by also using or taking into account the characteristics of the impedance inverters by which the currents and voltage are inverted.

In the following Section (A) the linear transfer function is proven. The efficiency is calculated in Section (B).

(A) Proof of the linear transfer function of the three channel amplifier.

The three channel amplifier shown in FIG. 4a is controlled by an input signal having the envelope curve $$V_{inO}[V_{in}/V_{inO}] \tag{1}$$

The control of the individual amplifiers is accomplished by the control network with the voltages $$V_{in,i} = V_i/\text{GAIN, wherein } i = 1, 2, 3 \tag{2}$$

According to the vector diagrams shown in FIGS. 4b, 4c, and 4d, it follows for the individual signal voltages at the output terminals of the amplifiers that $$\begin{aligned} V_2 &= V_O \\ V_1 &= V_O(\cos\Omega + j\sin\Omega) \\ V_3 &= V_O(\cos\Omega - j\sin\Omega) \end{aligned} \tag{3}$$

With the aid of the transfer function of the impedance inverters:

$$\begin{aligned} V_i &= O \cdot V_{ii} + R_O \cdot I_{ii} \\ I_i &= 1/R_O \cdot V_{ii} + O \cdot I_{ii}, \text{ wherein } i = 1, 2, 3. \end{aligned} \tag{4}$$

The currents at the outputs of the impedance inverters are obtained as follows:

$$\begin{aligned} I_{22} &= I_O \\ I_{11} &= I_O(\cos\Omega + j\sin\Omega) \\ I_{33} &= I_O(\cos\Omega - j\sin\Omega). \end{aligned} \tag{5}$$

The sum of the output currents in the load impedance is expressed as follows:

$$I_{out} = I_O(1 + 2\cos\Omega). \tag{6}$$

and the voltage at the load is expressed as follows:

$$V_{out} = I_{out} R_{load} = V_O(1 + 2\cos\Omega)/3 \tag{7}$$

The linear transfer function:

$$V_{out}/V_O = V_{in}/V_{inO} \cdot \text{GAIN} \tag{8}$$

of the entire three channel amplifier shown in FIG. 4a is caused by the following dependency of the phase angle $\Omega$ from the input signal:

$$\Omega = \arccos[(3V_{in}/V_{inO} - 1)/2]. \tag{9}$$

B) Determination of efficiency of the three channel amplifier of FIG. 4a.

The impedances in the individual channels at the outputs of the impedance inverters are expressed as follows:

$$Z_{22} = V_{out}/I_{22} = R_O(1 + 2\cos\Omega)/3 \qquad (10)$$
$$Z_{11} = V_{out}/I_{11} = Z_{22}(\cos\Omega - j\sin\Omega)$$
$$Z_{33} = V_{out}/I_{33} = Z_{22}(\cos\Omega + j\sin\Omega).$$

The impedance transformation by the impedance inverters leads to the following admittances:

$$Y_2 = Z_{22}/R_O^2 = 1/R_O(1 + 2\cos\Omega)/3 \qquad (11)$$
$$Y_1 = Z_{11}/R_O^2 = Y_2(\cos\Omega - j\sin\Omega)$$
$$Y_3 = Z_{33}/R_O^2 = Y_2(\cos\Omega + j\sin\Omega).$$

The middle amplifier B is loaded by the admittance $Y_2$ which has a pure reel character. For reducing the reactive loading of the two amplifiers A and C, the following additional susceptances $-B_C$ and $+B_C$ inserted, whereby:

$$Y_1^* = Y_1 + jB_C$$
$$Y_3^* = Y_3 + jB_C \qquad (12)$$

wherein:

$$B_C = 1/R_O(1 + 2\cos\Omega)/3 \cdot \sin\Omega \qquad (13)$$

so that the reactive load for two values $\Omega 1$ and $\Omega 2$ of $\Omega$ can be so compensated that the load of the amplifiers becomes purely real.

The DC current input $I_{DCi}$ of the individual amplifiers is calculated on the basis of the DC current values (absolute values) of the individual output currents $I_i$ as follows:

$$I_{DCi} = \text{const} \cdot |I_i| = 2/\pi \cdot |I_i|, \text{ wherein } i=1,2,3, \qquad (14)$$

whereby a sinusoidal curve is assumed for P(t) as well as class B operation of the individual amplifiers. Since the supply voltage of the individual amplifiers corresponds to the peak value $V_O$ of the output voltages, the following applies:

$$I_{DC2} = 2/\pi \cdot |I_2| = 2/\pi \cdot V_O \cdot |Y_2|$$
$$I_{DC1} = 2/\pi \cdot |I_1| = 2/\pi \cdot V_O \cdot |Y_1^*| \qquad (15)$$
$$I_{DC3} = 2/\pi \cdot |I_3| = 2/\pi \cdot V_O \cdot |Y_3^*| = I_{DC1}$$

The DC power input of the entire three channel amplifier system is calculated as follows:

$$P_{DC} = V_O(I_{DC2} + 2I_{DC1}) = 2/\pi \cdot V_O^2 \cdot [|Y_2| + 2|Y_1|] \qquad (16)$$

The output power is calculated as follows:

$$P_{out} = \text{const} \cdot \text{Re}\{V_{eff}I_{eff}\}. \qquad (17)$$

With the assumed sinusoidal curve of P(t) the following applies:

$$P_{out} = \tfrac{1}{2} \cdot \text{Re}\{V_{out}I_{out}\} = \tfrac{1}{2} \cdot 3 \cdot V_O^2/R_O(1 + 2\cos\Omega)/3 \qquad (18)$$

$$P_{out} = \tfrac{1}{2} \cdot 3 \cdot V_O^2/R_O(V_{out}/V_O)^2$$

hence, the efficiency ETA is calculated as follows:

$$ETA = P_{out}/P_{DC} = \pi/4 \cdot \{3(V_{out}/V_O)^2\}/\{R_O(|Y_2| + 2|Y_1|)\} \qquad (19)$$

The expression $\pi/4$ is due to the fact that in the example Class B amplifiers are used for each of the three individual amplifiers A, B, and C. In the general case it is possible to replace expression $\pi/4$ by the value of the efficiency of the individual amplifiers at full modulation, said value being $ETA_{amp}$. The quotient of the two expressions in the curved brackets provides the system efficiency of:

$$ETA_{Sys,3K} \qquad (20)$$

of the three channel amplifier for each value of a partial modulation as follows:

$$ETA_{Sys,3K} = \{3(V_{out}/V_O)^2\}/\{R_O(|Y_2| + 2|Y_1|)\} \qquad (21)$$

Thus, the efficiency becomes:

$$ETA = ETA_{amp} \cdot ETA_{Sys,3K} \qquad (22)$$

An individual linear amplifier has, or several conventional linear amplifiers connected in prallel to each other have, an efficiency which, in the best instance, class-B operation, is proportional to the voltage of the modulation or control.

$$ETA = \pi/4 \cdot (V_{out}/V_O) \qquad (23)$$

The system efficiency:

$$ETA_{Sys,ClassB} \qquad (24)$$

of a class-B amplifier at partial modulation or control is thus:

$$ETA_{Sys,ClassB} = (V_{out}/V_O) \qquad (25)$$

Figure 5A:
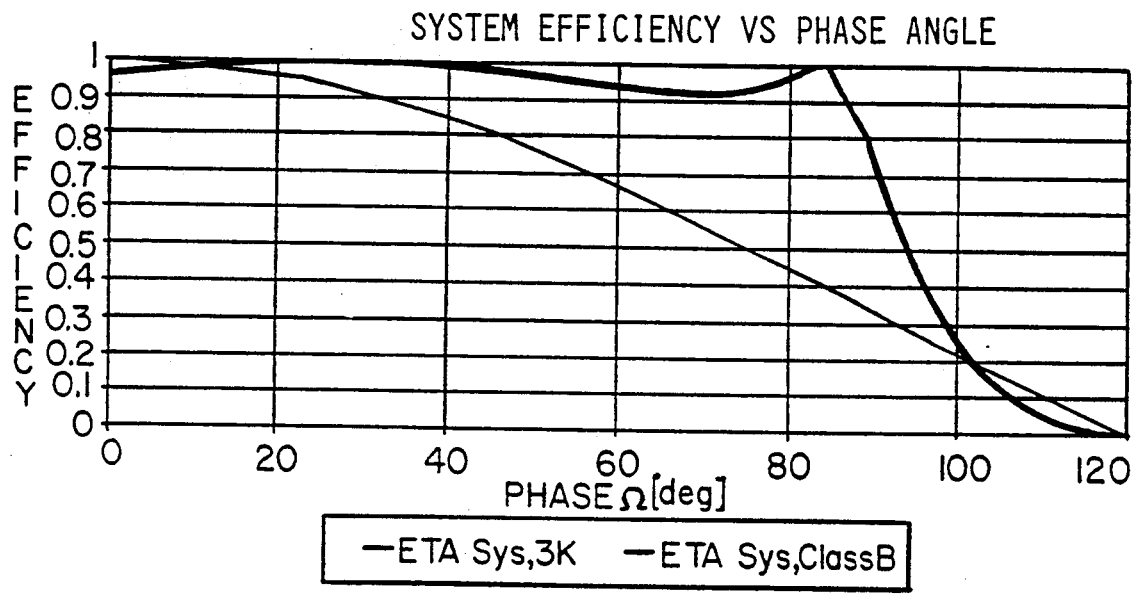
FIG. 5a shows the system efficiency of a three channel amplifier system as a function of the phase angle $\Omega$.
Figure 5B:
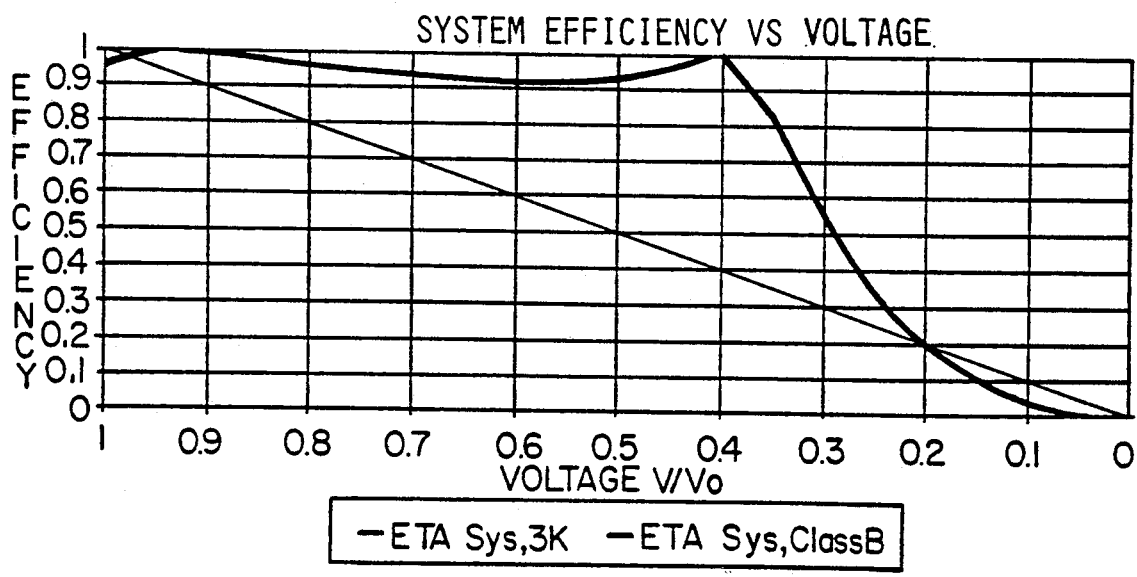
FIG. 5b shows the system efficiency of a three channel amplifier system as a function of the input or output voltage.

FIG. 5a shows by a thin line the system efficiency of a conventional class-B amplifier while the heavy line or curve represents the system efficiency of the three channel amplifier according to the invention, so that the two efficiencies can be compared. The efficiency is drawn as a function of the phase angle $\Omega$. FIG. 5b illustrates the system efficiency as a function of the standardized input (output) voltage $V/V_O$. The susceptances in FIGS. 5a and 5b have the value of:

$$B_C = 0.3962 \cdot 1/R_O \qquad (26)$$

Figure 6:
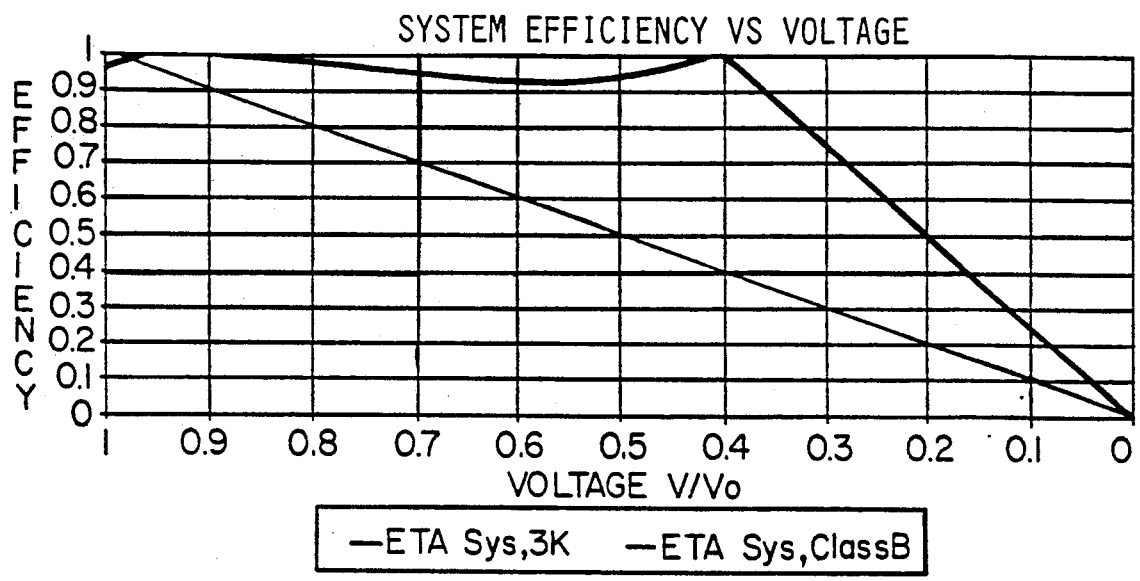
FIG. 6 shows the system efficiency of a three channel amplifier system as a function of the input or output voltage, in the case, that the phase control has been limited to angles less than 90 degrees.

As shown in FIGS. 4b, 4c, and 4d negative currents $I_1$ and $I_3$ flow for phase angles $\Omega$ larger than 90°. In order to avoid that the amplifiers A and B operate as sinks, the phase control is performed only to a maximum of 90°. For small input signals $V_{in}/V_{inO}$ which would correspond to a phase control or modulation of $\Omega > 90°$, the three channel amplifier is operated with a constant phase as conventional amplifiers are operated when such amplifiers are connected in parallel. This measure results in an additional improvement of the efficiency for small input signals as shown in FIG. 6, illustrating the efficiency as a function of the voltage.

A further possibility of improving the efficiency resides in performing the phase control only within the range between the two phase angles $\Omega 1$ and $\Omega 2$. For small input signals which correspond to a phase angle larger than $\Omega 2$, the three channel amplifier is again operated in a conventional manner corresponding to three amplifiers connected in parallel with one another. Since the full control or modulation is now to be achieved for the phase angle $\Omega 1$, it is necessary to change the load impedance $R_{load}$ as follows:

$$R_{load} = Z_{22}(\Omega 1) = R_O(1+2\cos 1)/3\Omega. \quad (27)$$

This requirement can easily be satisfied by means of a fixed matching network which provides the required impedance transformation. This fixed or hard wired matching network may also be used to transform the load impedance $R_{load}$ required by the three channel amplifier, into any desired impedance for matching purposes.

Figure 7:
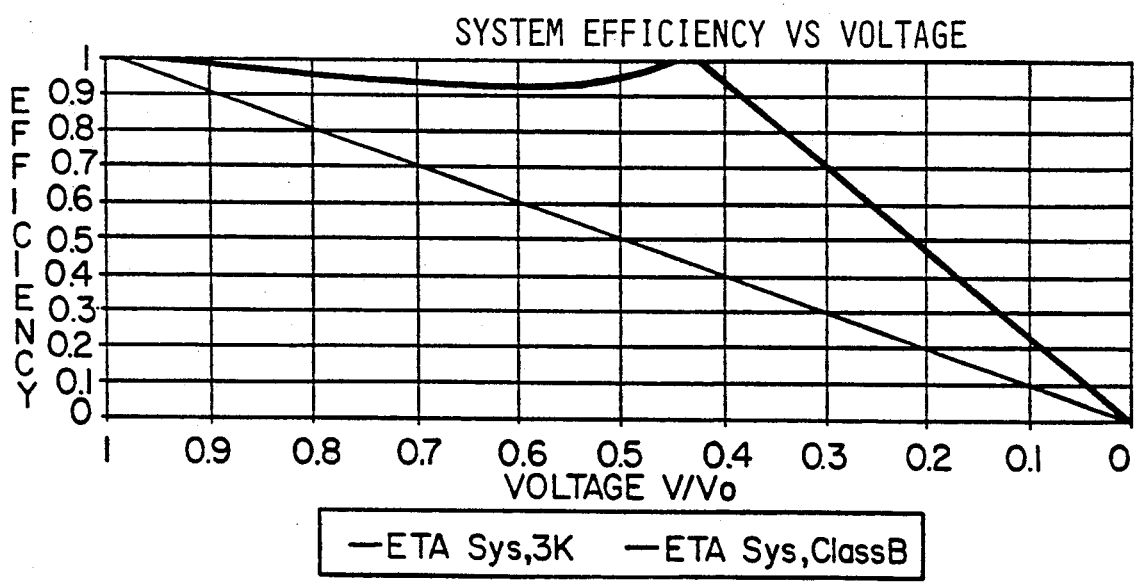
FIG. 7 shows the system efficiency of a three channel amplifier system as a function of the input or output voltage, in the case, that the phase control has been limited to phase angles in the range $\Omega_1$ to $\Omega_2$, the reactive loading of the amplifiers A and B has been compensated by means of shunt susceptances for the phase angles $\Omega_1$ and $\Omega_2$ in a perfect manner.

FIG. 7 shows the efficiency as a function of the input-/output voltage where the parameter for $B_C$ is selected to be:

$$B_C = 0.3962/R_O \quad (28)$$

which corresponds to the phase angle $\Omega 1 = 25°$ and $\Omega 2 = 84.43°$. By a suitable selection of $B_C$, $\Omega 1$, $\Omega 2$, and $R_{load}$, it is possible to adapt the efficiency as a function of the input/output voltage, to any desired requirements.

Although the above example shows the functional ability of the invention with reference to a three channel amplifier, it is to be understood that the invention is also functional for amplifier systems have any number of channels as illustrated in connection with the N-channel system shown in FIG. 3a. Further, it is to be noted that it is not absolutely necessary to use class-B amplifiers for the individual amplifiers. Rather, any desirable amplifier type can be used, for example, a class-C-amplifier, adaptive bias amplifiers, voltage switched amplifiers, of class D, E, and S as well as harmonic resonator amplifiers of classes F, G, and H are suitable for the present purposes. The only limitation that must be made resides in the fact that the DC power input of the individual amplifiers must not be constant if the amplifiers are operated with a partial modulation or control. The use of exclusively class-A amplifiers in the N-channel method or system would satisfy the linearity requirements. However, an increase of the efficiency compared to such conventional amplifiers would not be obtained.

Although the invention has been described with reference to specific example embodiments, it will be appreciated that it is intended to cover all modifications and equivalents within the scope of the appended claims.

What I claim is:

1. A method for the linear amplification of signals, comprising the following steps:
   (a) forming an uneven number of at least three amplifier impedance inverter units by separately feeding an output signal of each of an uneven number of at least three individual amplifiers to an input of a respective impedance inverter;
   (b) connecting outputs of said uneven number of at least three amplifier impedance inverter units to a common load;
   (c) controlling said uneven number of at least three individual amplifiers through an input control network; and
   (d) connecting shunt susceptances to output terminals of an even number of said at least three individual amplifiers, in order to compensate a reactive loading of said even number of said amplifiers, for improving the amplification efficiency.

2. The method of claim 1, comprising connecting said uneven number of amplifier impedance inverter units in parallel with one another.

3. A linear signal amplifier system, comprising an uneven number of at least three individual amplifiers, an uneven number of at least three impedance inverters, means electrically connecting an output of each individual amplifier to an input of its respective impedance inverter to form an uneven number of at least three amplifier impedance inverter units, means electrically connecting all amplifier impedance inverter units to the same load, input control means for controlling an input signal to said uneven number of at least three amplifiers, means for connecting said input control means to an input of each of said individual amplifiers, said uneven number of at least three amplifier impedance inverter units being connected in parallel to one another, and shunt susceptance means electrically connected to output terminals of an even number of said individual amplifiers for compensating a reactive loading of said even number of individual amplifiers, thereby improving the amplification efficiency.

* * * * *